(12) United States Patent
Ibbetson et al.

(10) Patent No.: US 8,884,510 B2
(45) Date of Patent: *Nov. 11, 2014

(54) SEMICONDUCTOR LIGHT EMITTING DEVICES WITH DENSELY PACKED PHOSPHOR LAYER AT LIGHT EMITTING SURFACE (71) Applicant: Cree, Inc., Durham, NC (US)

(72) Inventors: James Ibbetson, Santa Barbara, CA (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,931

(22) Filed: Feb. 11, 2014

(65) Prior Publication Data

US 2014/0161147 A1 Jun. 12, 2014

Related U.S. Application Data (60) Continuation of application No. 13/780,132, filed on Feb. 28, 2013, now Pat. No. 8,684,781, which is a division of application No. 12/887,097, filed on Sep. 21, 2010, now Pat. No. 8,410,679.

(51) Int. Cl.
*H01L 33/50* (2010.01)
*F21K 99/00* (2010.01)
*H05B 33/10* (2006.01)

(52) U.S. Cl.
CPC ............... *H01L 33/50* (2013.01); *H05B 33/10* (2013.01); *H01L 33/501* (2013.01); *H01L 2224/48091* (2013.01); *F21K 9/56* (2013.01); *H01L 2224/48247* (2013.01); *H01L 33/508* (2013.01); *H01L 2933/0041* (2013.01)
USPC ......... 313/501; 313/503; 257/98; 257/E33.06

(58) Field of Classification Search
CPC ....................................... H01L 33/50
USPC ....................... 313/501, 503; 257/98, E33.06
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,650,044 B1 | 11/2003 | Lowery |

(Continued)

*Primary Examiner* — Elmito Breval
(74) *Attorney, Agent, or Firm* — Myers Bigel Sibley & Sajovec (57) ABSTRACT

An LED includes a chip having a light emitting surface, and a coating of phosphor-containing material on the light emitting surface. The phosphor-containing material comprises at least two quantities of different phosphor particles and are arranged in a densely packed layer within the coating at the light emitting surface. The densely packed layer of phosphor particles does not extend all the way through the coating.

20 Claims, 8 Drawing Sheets

(56) References Cited

U.S. PATENT DOCUMENTS

| | | |
|---|---|---|
| 2002/0123164 A1 | 9/2002 | Slater, Jr. et al. |
| 2003/0006418 A1 | 1/2003 | Emerson et al. |
| 2004/0056260 A1 | 3/2004 | Slater, Jr. et al. |
| 2007/0001178 A1 | 1/2007 | Tran et al. |
| 2007/0128745 A1 | 6/2007 | Brukilacchio et al. |
| 2007/0228933 A1 | 10/2007 | Maruyama et al. |
| 2008/0251806 A1 | 10/2008 | Erchak |
| 2009/0309114 A1 | 12/2009 | Lu et al. |

SEMICONDUCTOR LIGHT EMITTING DEVICES WITH DENSELY PACKED PHOSPHOR LAYER AT LIGHT EMITTING SURFACE

RELATED APPLICATION

This application is a continuation application of pending U.S. patent application Ser. No. 13/780,132, filed Feb. 28, 2013, which is a divisional application of U.S. patent application Ser. No. 12/887,097, filed Sep. 21, 2010, now U.S. Pat. No. 8,410,679, the disclosures of which are incorporated herein by reference as if set forth in their entireties.

FIELD OF THE INVENTION

This invention relates to lighting devices, and more particularly to semiconductor light emitting devices including wavelength conversion materials.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer). In other embodiments, a substrate need not be included.

It is known to enclose an LED chip in a package that can perform a number of functions and provide a number of benefits. For example, an LED package can provide mechanical support and environmental protection for the chip, as well as providing electrical leads for connecting the chip to an external circuit, and heatsinks for efficient heat extraction from the chip. An LED package can also perform optical functions. For example, an LED package can include optical materials and/or structures, such as lenses, reflectors, light scattering layers, etc., that can direct light output by the semiconductor chip in a desired manner.

Figure 1:
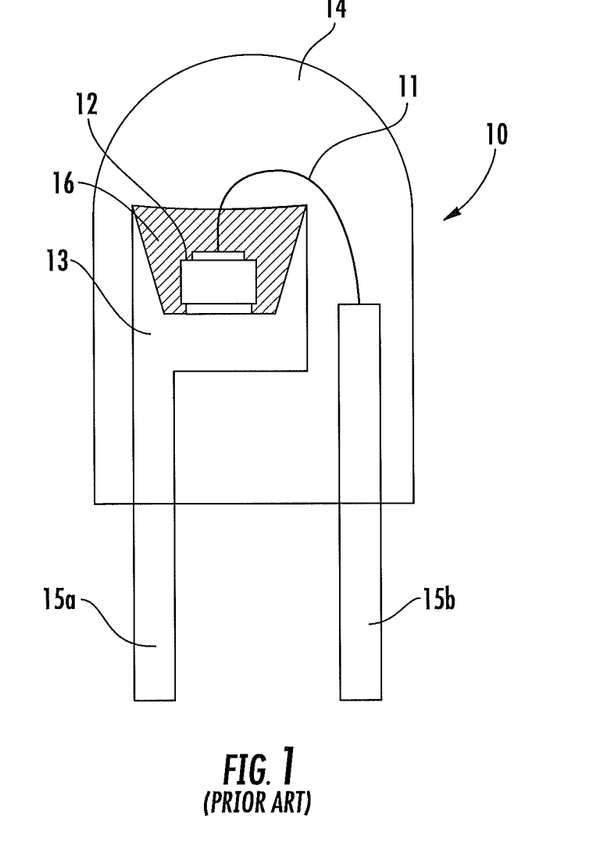
FIG. 1 is a cross-sectional side view illustrating a conventional packaged LED.

In a typical LED package 10 illustrated in FIG. 1, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as phosphor particles. The entire assembly may then be encapsulated in a clear protective resin 14, which may be molded in the shape of a lens to collimate the light emitted from the LED chip 12.

It is often desirable to incorporate phosphor into an LED package to enhance the emitted radiation in a particular wavelength and/or to convert at least some of the radiation to another wavelength. In general, light is emitted by a phosphor when a photon having energy higher than a bandgap of the phosphor material passes through the phosphor and is absorbed. When the photon is absorbed, an electronic carrier in the phosphor is stimulated from a resting state to an excited state. When the electronic carrier decays back to a resting state, a photon can be emitted by the phosphor. However, the emitted photon may have an energy that is less than the energy of the absorbed photon. Thus, the emitted photon may have a wavelength that is longer than the absorbed photon.

The term "phosphor" is used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent and/or phosphorescent. In general, phosphor particles absorb light having shorter wavelengths and re-emit light having longer wavelengths. As such, some or all of the light emitted by the LED chip at a first wavelength may be absorbed by the phosphor particles, which may responsively emit light at a second wavelength. For example, a single blue emitting LED chip may be surrounded with a yellow phosphor, such as cerium-doped yttrium aluminum garnet (YAG). The resulting light, which is a combination of blue light and yellow light, may appear white to an observer.

Typically, phosphor particles are randomly distributed within the matrix of encapsulant material. Some or all of the light emitted by the LED chip at a first wavelength may be absorbed by the phosphor particles, which may responsively emit light at a second wavelength. For example, a blue-emitting chip may be encapsulated with an encapsulant matrix including a yellow-emitting phosphor. The combination of blue light (from the chip) with yellow light (from the phosphor) may produce a light that appears white. Some red-emitting phosphor particles may be included in the encapsulant matrix to improve the color rendering properties of the light, i.e. to make the light appear more "warm." Similarly, a UV-emitting chip may be encapsulated with an encapsulant material including phosphor particles that individually emit red, green and blue light upon excitation by UV light. The resulting light, which is a combination of red, green and blue light, may appear white and may have good color rendering properties.

Figure 2:
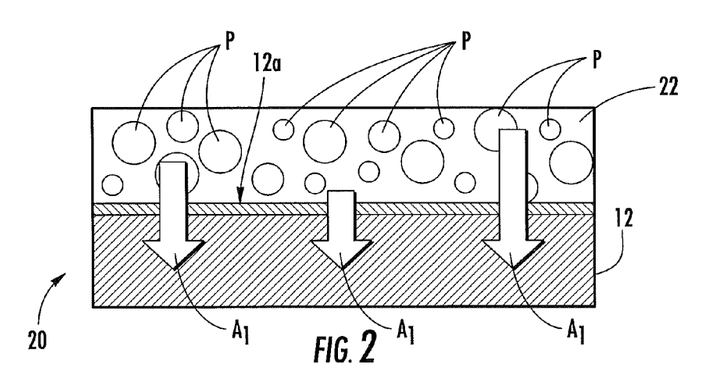
FIG. 2 is a cross sectional view of an LED illustrating a conventional phosphor-containing material applied to a light emitting surface of an LED chip.
Figure 3:
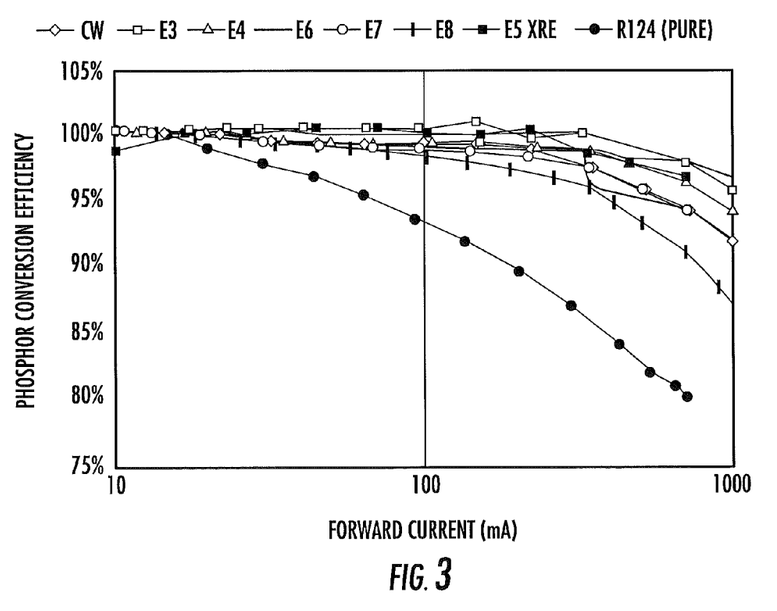
FIG. 3 is a graph illustrating heat transfer characteristics of the light emitting device of FIG. 2.

It is important to control the junction temperature of phosphor converted LEDs in order to provide a long life for LEDs. In conventional LEDs, the distribution of phosphor particles in a coating on an LED chip is essentially uniform. FIG. 2 illustrates a conventional LED 20 that includes a chip 12 and a coating of phosphor-containing material 22, such as silicone, on the light emitting surface 12a of the chip 12. Because of the generally uniform distribution of the phosphor particles P in the silicone matrix 22, the average distance that heat generated by the Stokes loss has to travel is approximately half the coating thickness, for example 25-50 μm, depending on the target color point. Arrows $A_1$ graphically illustrate the different distances that heat travels from the various phosphor particles P to the chip 12. Due to the low thermal conductivity of the silicone matrix 22, heat from the down-conversion event may not be easily dissipated, causing the phosphor particles P to heat up and reduce their efficiency. Self-heating of the phosphor particles P, along with poor heat conduction through the coating material 22, causes LED chip efficiency to drop with increasing flux density, as illustrated in FIG. 3.

Moreover, the effects become more pronounced as the thickness of the phosphor-containing material 22 increases.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

Embodiments of the present invention reduce phosphor self-heating effects by improving heat transfer between phosphor particles and an LED chip by reducing the average separation between phosphor particles and the chip surface, and by reducing the regions of direct physical contact between phosphor particles and the chip surface.

In some embodiments of the present invention, an LED includes a light emitting element (i.e., an LED chip) having a light emitting surface, and a coating of phosphor-containing material (e.g., silicone) on the light emitting surface. The phosphor particles are arranged in a densely packed layer within the coating at the light emitting surface, and such that the light emitting surface is in contacting relationship with the layer of phosphor particles. The light emitting surface emits light having a first dominant wavelength upon the application of a voltage to the LED chip. The phosphor particles convert light emitted by the light emitting surface to light having a second dominant wavelength different from the first dominant wavelength.

Because the densely packed layer of phosphor particles is located at the light emitting surface, coating material above the densely packed layer of phosphor particles is devoid of phosphor particles, and can be removed and/or reduced, if desired. Also, because the densely packed layer of phosphor particles is in contacting relationship with the light emitting surface, heat transfer between the phosphor particles and the LED chip is substantially improved over conventional LEDs. For example, an average distance that heat generated by the phosphor particles travels from the densely packed layer to the LED chip is substantially less than about half a thickness of the coating.

In some embodiments, the light emitting surface may include a pattern of features formed therein that extend outward to form receptacles for receiving phosphor particles. These receptacles provide more surface area for phosphor particles to contact, thereby further enhancing heat transfer from the phosphor particles.

In other embodiments, an intermediate layer of material (e.g., silicon nitride, etc.) may be placed between the light emitting surface and coating of phosphor-containing material. The intermediate layer of material includes a pattern of features formed therein that extend outward to form receptacles for receiving phosphor particles. As described above, these receptacles provide more surface area for the phosphor particles to contact, thereby further enhancing heat transfer from the phosphor particles.

According to some embodiments of the present invention, a method of making a semiconductor light emitting device includes applying a phosphor-containing material (e.g., silicone, silicon, or any optical grade indexing matching carrier) on at least a portion of a light emitting surface of a chip, causing phosphor particles in the material to become arranged in a densely packed layer within the material at the light emitting surface, and curing the material without disturbing the densely packed layer of phosphor particles. In some embodiments, cured material above the densely packed layer of phosphor particles that is devoid of phosphor particles can be removed and/or reduced.

In some embodiments, causing the phosphor particles in the material to become arranged in a densely packed layer at the light emitting surface includes subjecting the chip to centrifugal force. In some embodiments, causing the phosphor particles in the material to become arranged in a densely packed layer at the light emitting surface includes subjecting the phosphor-containing material to at least one harmonic vibration, for example, via a vibration table, or via ultrasonic vibration, etc.

In other embodiments, causing the phosphor particles to become arranged in a densely packed layer at the light emitting surface includes heating the material to a predetermined temperature for a predetermined time to lower the viscosity of the material such that the phosphor particles can settle under the force of gravity. In some embodiments, the material may be directly heated. In some embodiments, the material may be directly heated and/or indirectly heated via the chip.

In other embodiments, the viscosity of the phosphor-containing material can be lowered via the addition of a solvent, such as hexane or xylene. The solvent reduces viscosity by breaking the polymer chains (e.g., silicone chains) of the phosphor-containing material, causing the phosphor particles to drop out. The solvent is subsequently removed, for example, via evaporation prior to curing of the phosphor-containing material. The polymer chains become re-established upon removal of the solvent.

In some embodiments, a pattern of features is formed in the light emitting surface prior to applying the phosphor-containing material. As described above, the features extend outward to form receptacles for receiving the phosphor particles.

In other embodiments, an intermediate layer of material (e.g., silicon nitride, etc.) is applied to the light emitting surface prior to applying the phosphor containing material. The intermediate layer of material includes a pattern of features extending outward therefrom that form receptacles for receiving the phosphor particles. The phosphor-containing material is applied to the intermediate layer of material.

According to other embodiments of the present invention, a method of making a semiconductor light emitting device includes applying a phosphor-containing carrier material on at least a portion of a light emitting surface of an LED chip. To obtain a uniform distribution of phosphor particles across the light emitting surface, the chip may be agitated in some manner. The phosphor particles in the carrier material are then caused to become arranged in a densely packed layer at the light emitting surface, and such that the light emitting surface is in contacting relationship with the layer of phosphor particles. For example, in some embodiments, causing the phosphor particles in the material to become arranged in a densely packed layer at the light emitting surface comprises subjecting the chip to centrifugal force. The carrier material is removed without disturbing the densely packed layer of phosphor particles, and a layer of encapsulating material (e.g., silicone) is applied to the densely packed layer of phosphor particles, also without disturbing the densely packed layer of phosphor particles. The encapsulating material is then cured without disturbing the densely packed layer of phosphor particles.

In some embodiments, a pattern of features is formed in the light emitting surface prior to applying the phosphor-containing carrier material. The outwardly extending features form receptacles for receiving the phosphor particles, as described above. In other embodiments, an intermediate layer of material (e.g., silicon nitride, etc.) is applied to the light emitting surface prior to applying the phosphor-containing carrier material. The intermediate layer of material includes a pattern of features extending outward therefrom that form receptacles for receiving the phosphor particles.

According to some embodiments of the present invention, a method of making a semiconductor light emitting device includes sequentially applying first, second and third quantities of phosphor particles to at least a portion of a light emitting surface of a semiconductor light emitting element. The phosphor particles in the second quantity are larger than the phosphor particles in both the first and third quantities. The smaller phosphor particles in the first and third quantities become closely arranged around the larger phosphor particles in the second quantity so as to form a densely packed layer at the light emitting surface. A layer of encapsulating material (e.g., silicone) is applied to the densely packed layer of phosphor particles and then cured without disturbing the densely packed layer of phosphor particles.

In some embodiments, the first, second and third quantities of phosphor particles are sequentially applied to at least a portion of the light emitting surface through a liquid material, such as silicone, wherein the viscosity of the liquid material has been reduced. In some embodiments, the viscosity of the liquid material may be reduce by heating the liquid material. In some embodiments, the viscosity of the liquid material is reduced by a solvent, such as xylene or hexane.

According to some embodiments of the present invention, a method of making a semiconductor light emitting device includes applying an amount of phosphor-containing material on at least a portion of a light emitting surface of a semiconductor light emitting element, and causing phosphor particles in the material to become arranged in a densely packed layer within the material at the light emitting surface when the amount of phosphor-containing material is sufficient to convert light to a desired color point. The material is then cured without disturbing the densely packed layer of phosphor particles. In some embodiments, light conversion by the phosphor-containing material is measured substantially in real time as the phosphor-containing material is being applied to the light emitting surface. The phosphor particles are caused to become arranged in a densely packed layer at the light emitting surface by applying a solvent to the phosphor-containing material. The solvent is removed prior to curing.

According to some embodiments of the present invention, a lighting device (e.g., a component, a module, a self-ballasted lamp or light fixture, etc.) includes an LED chip that emits light having a first dominant wavelength upon the application of a voltage thereto, and a coating of phosphor-containing material on a light emitting surface of the chip. The phosphor particles are arranged in a densely packed layer within the material at the light emitting surface such that the light emitting surface is in contacting relationship with the layer of phosphor particles. The phosphor particles convert light emitted by the light emitting surface to light having a second dominant wavelength different from the first dominant wavelength. Because the densely packed layer of phosphor particles is in contacting relationship with the light emitting surface, heat transfer between the phosphor particles and the chip is substantially improved. For example, an average distance that heat generated by the phosphor particles travels from the densely packed layer to the chip is substantially less than about half a thickness of the coating.

According to some embodiments of the present invention, a semiconductor light emitting device includes a semiconductor light emitting element having a light emitting surface, an element in adjacent, spaced spaced-apart relationship with the light emitting surface, and a coating of phosphor-containing material on the element, wherein phosphor particles are arranged in a densely packed layer within the coating. In some embodiments, the spaced-apart element is a lens. In some embodiments, the spaced-apart element is reflective element. In some embodiments, the spaced-apart element is a combination of a lens and reflective element. In some embodiments, the spaced-apart element is a layer of material.

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail below.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "densely packed", as used herein means that a first layer or stratum contains a high concentration of phosphor particles and a second layer or stratum above the first layer contains a substantially lower concentration of phosphor particles than the first layer/stratum. The term "densely packed" also refers to any particle packing that has a particle density greater than that which would occur naturally or if the technique applied was not used. For example, if a layer of phosphor particles typically has a thickness of "X", causing the particles to become densely packed in accordance with embodiments of the present invention would result in a thickness of "<X".

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention LED chip structures that reduce the average distance that heat generated by phosphor particles has to travel by causing the phosphor particles to settle in a dense layer immediately above a chip surface. Heat flow is thereby improved so that the phosphor temperature at a given flux density is reduced, thus improving the device efficiency, especially at high flux densities. In some embodiments, surface features are added to a chip which increase the direct contact area between the phosphor particles and chip. Heat flow is further improved as a result. Embodiments of the present invention are particularly advantageous because, in addition to improvements in efficiency under normal operating conditions (i.e., steady state), settling a predetermined amount of phosphor enables a specific color point to be met.

Figure 4A:
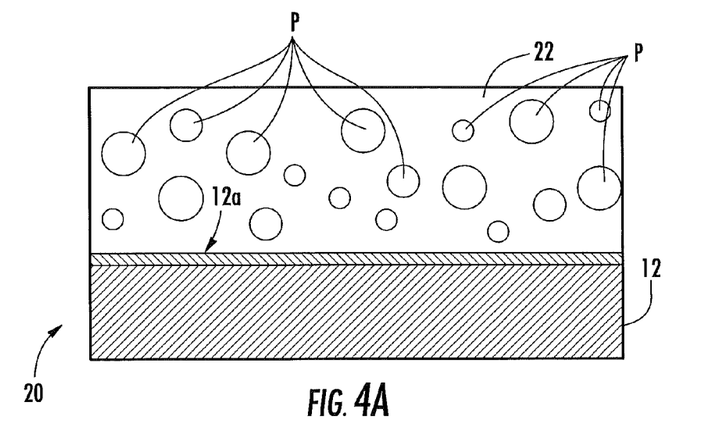
FIG. 4A is a cross sectional view of an LED chip immediately after a phosphor-containing material has been applied to the light emitting surface, according to some embodiments of the present invention.
Figure 4B:
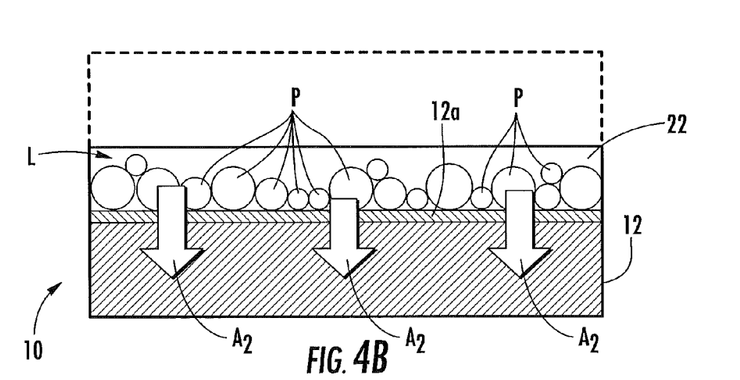
FIG. 4B illustrates the light emitting device of FIG. 4A after phosphor particles have formed a densely packed layer at the light emitting surface, according to some embodiments of the present invention.

Referring now to FIGS. 4A-4B, an LED 20, according to embodiments of the present invention, includes a semiconductor light emitting element (i.e., chip) 12 having a light emitting surface 12a and a coating of phosphor-containing material 22, such as transparent silicone, on the light emitting surface 12a. The light emitting surface 12a emits light having a first dominant wavelength upon the application of a voltage to the chip 12. The phosphor particles P in the coating material 22 convert light emitted by the light emitting surface 12a to light having a second dominant wavelength different from the first dominant wavelength. As used herein, "light" refers to any radiation, visible and/or invisible (such as ultraviolet) that is emitted by an LED chip. Moreover, as used herein, the term "transparent" means that at least some optical radiation that enters the coating of phosphor-containing material 22 is emitted from the coating of phosphor-containing material 22.

Phosphor particles utilized in embodiments of the present invention may include Cerium-doped Yttrium Aluminum Garnet (YAG) and/or other conventional phosphors. The phosphor particles may be mixed into a paste or solution of transparent material comprising silicone using conventional mixing techniques, to thereby provide the phosphor-containing material 22. In some embodiments, the phosphor-containing material 22 may include a binder, such as an epoxy, a silicon-based matrix and/or other solvent. In some embodiments, the phosphor is configured to convert at least some light that is emitted from the light emitting surface 12a such that light that emerges from the LED 20 appears as white light. The phosphor-containing material 22 may be applied to the light emitting surface 12 in various ways including, but not limited to, screen printing, evaporation (sputter, e-beam, thermal, CVD, electrostatic and/or electropheoric deposition), dipping, spin coating and/or other techniques. The thickness of the phosphor-containing material 22 on the light emitting surface 12a may range between about 2 μm and about 100 μm, in some embodiments of the invention. However, other thicknesses may be used. The thickness that is used may be selected to reduce or minimize self-absorption and/or scattering and may depend on the coating process, the density of the phosphor and/or the desired application.

The chip 12 may be a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. In some embodiments, ultraviolet, blue and/or green LEDs may be provided. The design and fabrication of LEDs are well known to those having skill in the art and need not be described in detail herein.

LEDs, according to some embodiments of the present invention, may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, assigned to the assignee of the present invention, the disclosures of which are incorporated herein by reference in their entirety as if set forth fully herein. Other suitable LED and/or laser structures are described in published United States Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published United States Patent Application Publication No. US 2002/0123164 A1 entitled Light Emitting Diodes Including Modifications for Light Extraction and Manufacturing Methods Therefor, both assigned to the assignee of the present invention, the disclosures of both of which are hereby incorporated herein by reference in their entirety as if set forth fully herein. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention.

FIG. 4A illustrates an LED 20 directly after a phosphor-containing material 22 has been applied to the light emitting surface 12a of the chip 12. As illustrated, the phosphor particles P are substantially uniformly distributed within the coating material 22. FIG. 4B illustrates the LED 20 after the phosphor particles P in the material 22 have settled at the light emitting surface 12a and become arranged in a densely packed layer L, according to embodiments of the present invention. The densely packed layer L of phosphor particles P facilitates the transfer of heat from the phosphor particles P to the chip 12. Moreover, the location of the densely packed layer L at the light emitting surface 12a decreases the average distance heat generated by the phosphor particles P travels to the chip 12. Arrows $A_2$ graphically illustrate that the distance heat travels from the phosphor particles P to the chip 12 is substantially the same among the phosphor particles P, and the average distance of travel is substantially reduced compared with arrows $A_1$ of FIG. 2. For example, the average distance that heat generated by the phosphor particles P travels from the densely packed layer L to the chip 12 is substantially less than half the thickness of the coating 22.

Because the densely packed layer L of phosphor particles P is located at the light emitting surface 12a, coating material 22 above the densely packed layer L of phosphor particles P is devoid of phosphor particles P, and can be removed and/or reduced, if desired. The portion of the coating material 22 that can be removed and/or reduced is represented in FIG. 4B via a dotted line.

The phosphor particles P can be encouraged to become arranged in a densely packed layer L at the light emitting surface 12a in various ways. In some embodiments, the chip 12 and phosphor-containing coating material 22 can be subjected to centrifugal force, for example, via a centrifuge. In other embodiments, causing the phosphor particles P to become arranged in a densely packed layer L at the light emitting surface 12a includes heating the coating material 22 to a predetermined temperature and for a predetermined time to lower the viscosity of the coating material 22 such that the phosphor particles P can settle at the light emitting surface 12a prior to curing the coating material 22.

The amount of phosphor in the coating material 22 and the area covered by the phosphor-containing coating material 22 may be selected to provide a desired light output. The selection may be made in advance or may be tuned when the LED 20 is constructed. The phosphor-containing material 22 may be applied using any suitable phosphor deposition technique, such as by inkjet or bubble jet printing, screen deposition or other techniques.

Suitable red phosphors for embodiments of the present invention include, but are not limited to, $Sr_2Si_5N_8:Eu^{2+}$, and $CaAlSiN_3:Eu$. Other red phosphors that can be used include, but are not limited to, phosphors from the $Eu^{2+}$-SiAlON family of phosphors, as well as $CaSiN_2:Ce^{3+}$, $CaSiN_2:Eu^{2+}$ and/or phosphors from the $(Ca,Si,Ba)SiO_4:Eu^{2+}$(BOSE) family. Suitable yellow phosphors include, but are not limited to, $Y_3Al_5O_{12}:Ce^{3+}$(Ce:YAG), $CaAlSiN_3:Ce^{3+}$, and phosphors from the $Eu^{2+}$-SiAlON-family, and/or the BOSE family. Suitable green phosphors include, but are not limited to, phosphors from the BOSE family, as well as $CaSi_2O_2N_2:Eu^{2+}$. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available from numerous suppliers, including Mitsubishi Chemical Corporation, Tokyo, Japan, Leuchtstoffwerk Breitungen GmbH, Breitungen, Germany, and Intematix Company, Fremont, Calif.

Other suitable phosphors that may be utilized according to embodiments of the present invention include nanocrystals (NCs) with a cadmium selenide (CdSe) core surrounded by a zinc sulfide (ZnS) shell that can convert short wavelengths to longer ones. Such crystals can effectively absorb UV-green light and emit green-red light. The absorption and emission spectra of these NCs can be tuned by controlling the diameter of the CdSe core and the thickness of the ZnS shell. Moreover, the NCs have the advantages of high quantum efficiency and photostability. In particular, mixing the NCs with gold nanoparticles induces coupling between CdSe/ZnS NCs and surface plasmons (SPs) on the gold that can enhance the color conversion efficiency.

Figure 5A:
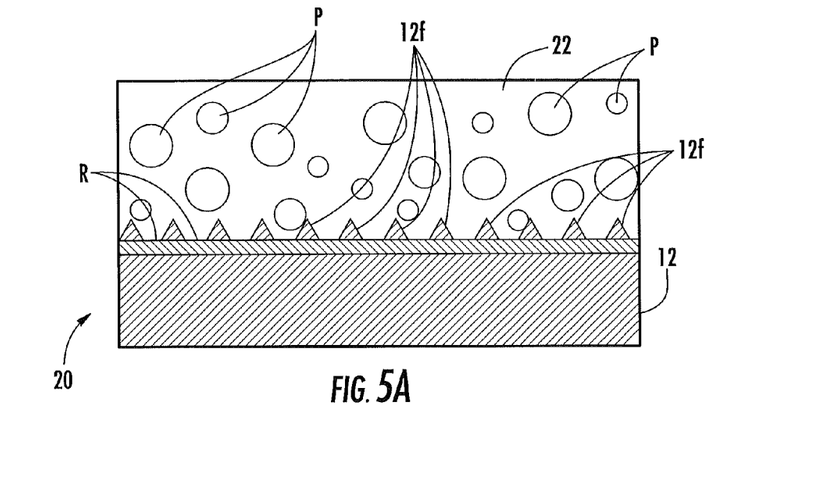
FIG. 5A is a cross sectional view of an LED chip having a pattern of features extending outwardly from the light emitting surface immediately after a phosphor-containing material has been applied to the light emitting surface, according to some embodiments of the present invention.
Figure 5B:
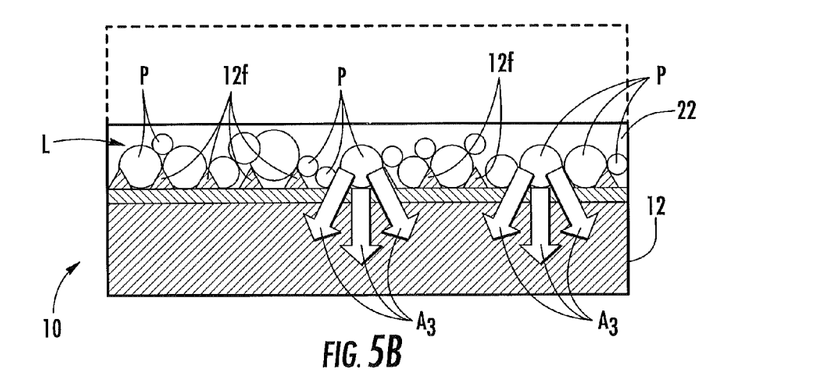
FIG. 5B illustrates the light emitting device of FIG. 5A after phosphor particles have formed a densely packed layer at the light emitting surface and are in contacting relationship with the receptacles, according to some embodiments of the present invention.

Referring now to FIGS. 5A-5B, an LED 20, according to other embodiments of the present invention, has a light emitting surface that includes a pattern of features 12f formed therein that extend outward to form receptacles R for receiving phosphor particles P. These receptacles R provide more surface area for the phosphor particles P to contact, thereby further enhancing heat transfer from the phosphor particles to the chip 12. The pattern of features 12f may be formed directly in an epitaxial layer of the light emitting element 12 or another intermediary layer (not shown), such as silicon nitride, may be provided with a pattern of features. In contrast with a planar light emitting surface, such as illustrated in FIGS. 4A-4B, wherein phosphor particles can only make single contact with a light emitting surface, the embodiment of FIGS. 5A-5B allows phosphor particles P to touch the light emitting surface 12a at multiple points. This is advantageous because the multiple contact points enhances heat transfer from the phosphor particles P to the chip 12. Arrows $A_3$ illustrate the multiple contact points of a phosphor particle P and, thus, the multiple heat transfer paths for each phosphor particle P.

Figure 6:
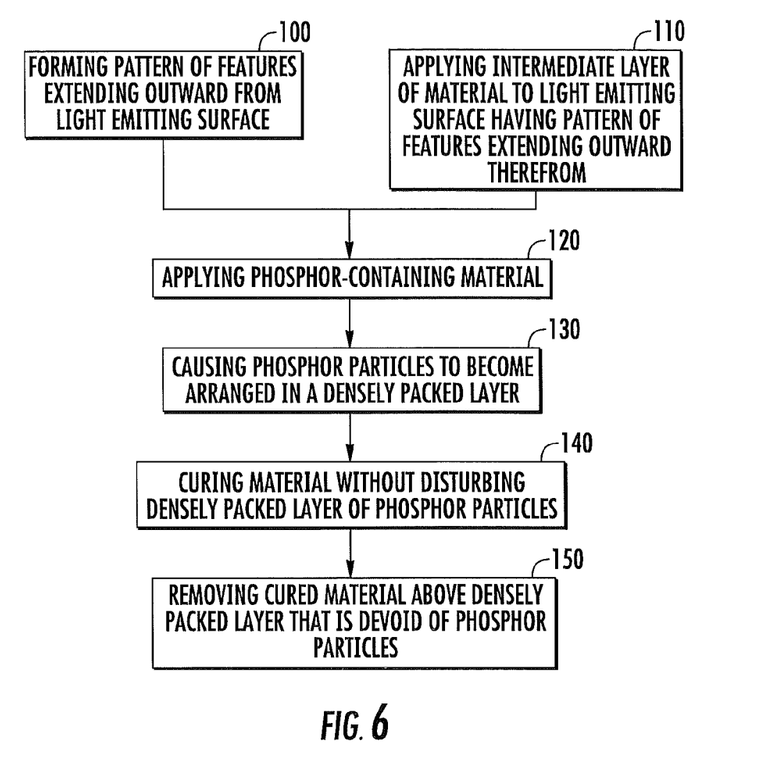
FIGS. 6-11 are flow charts of operations for making LEDs, according to embodiments of the present invention.
Figure 7:
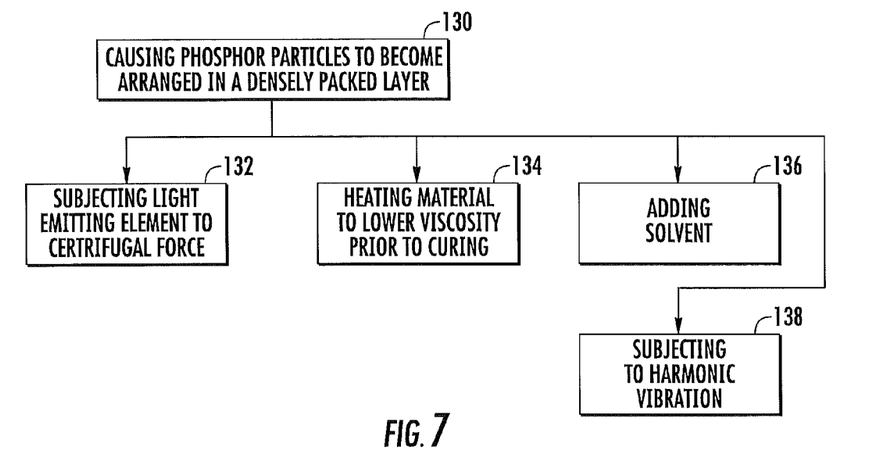

Operations for making LEDs, according to embodiments of the present invention, are described with reference to FIGS. 6-9. Referring initially to FIG. 6, in some embodiments, a pattern of features may be formed in a light emitting surface of an LED chip so as to extend outward therefrom and form receptacles configured to receive phosphor particles (Block 100). In other embodiments, an intermediate layer of material, such as silicon nitride, may be positioned on a light emitting surface of a chip (Block 110). The intermediate layer of material may include a pattern of features that extend outward and form receptacles configured to receive phosphor particles. A coating of phosphor-containing material is applied to the light emitting surface or to an intermediate layer on the light emitting surface (Block 120).

The phosphor particles in the coating material are caused to become arranged in a densely packed layer at the light emitting surface, or surface of an intermediate layer, if present (Block 130). The formation of the densely packed layer may be facilitated by subjecting the light emitting element to centrifugal forces, such as via a centrifuge (Block 132, FIG. 7) and/or by heating the coating material sufficiently to reduce viscosity such that the phosphor particles can settle to the chip surface (Block 134, FIG. 7) and/or by adding a solvent to the coating material (Block 136, FIG. 7). As would be understood by those of skill in the art, spinning via a centrifuge would move phosphor particles to outside (against chip surface). In some embodiments, causing the phosphor particles to become arranged in a densely packed layer at the light emitting surface includes subjecting the phosphor-containing material to at least one harmonic vibration, for example, via a vibration table (Block 138, FIG. 7). The coating material is then cured without disturbing the densely packed layer of particles (Block 140). For example, the coating material 22 may be cured at between about 50° C. and about 200° C. for about several seconds to several hours. In some embodiments, cured coating material above the densely packed layer that is devoid of phosphor particles is removed and/or reduced. (Block 150).

Figure 8:
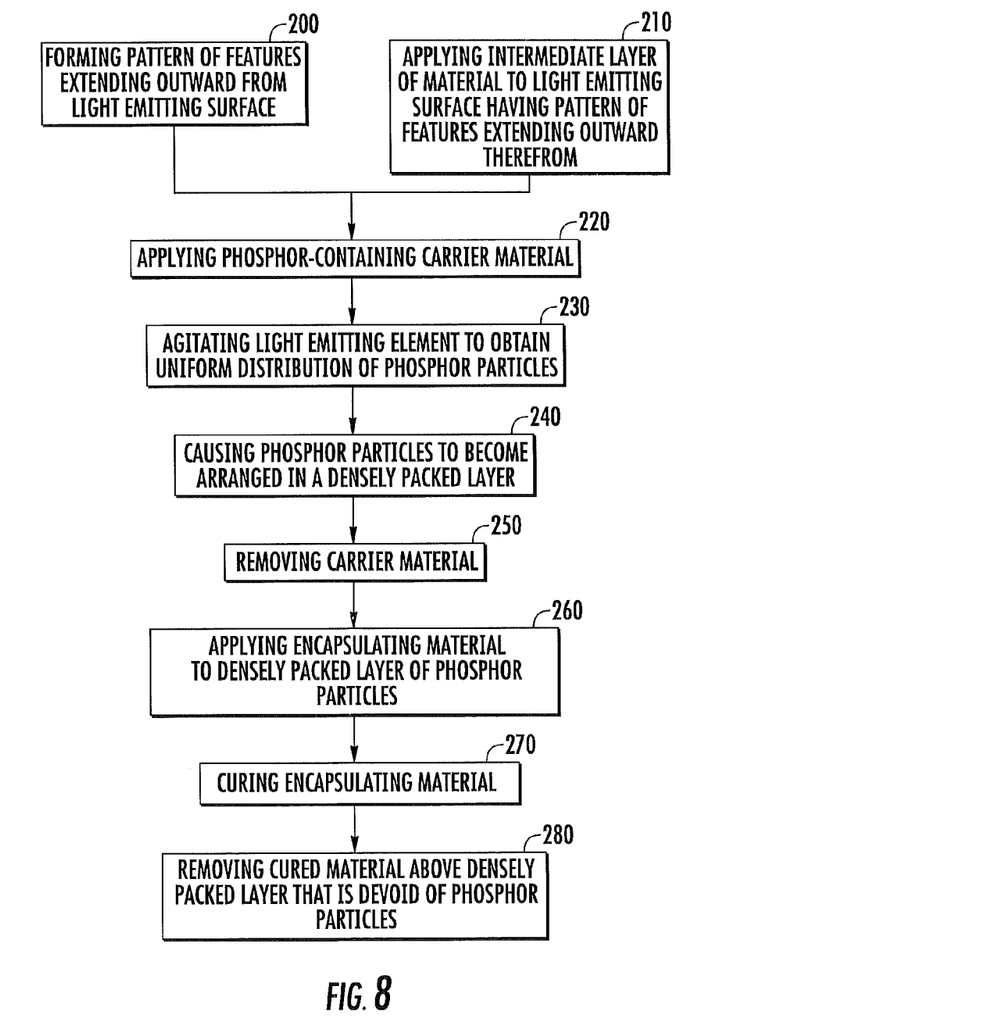
Figure 9:
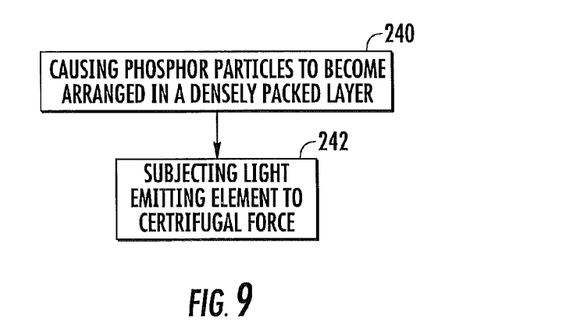

Referring to FIG. 8, operations for making LEDs, according to other embodiments of the present invention, are described. In some embodiments, a pattern of features may be formed in a light emitting surface of an LED chip so as to extend outward from the light emitting surface and form receptacles configured to receive phosphor particles (Block 200). In other embodiments, an intermediate layer of material, such as silicon nitride, may be positioned on a light emitting surface of a chip (Block 210). The intermediate layer of material may include a pattern of features that extend outward and form receptacles configured to receive phosphor particles. A phosphor-containing carrier material is then applied to the light emitting surface or to an intermediate layer on the light emitting surface (Block 220).

The light emitting element may be agitated in some manner to obtain uniform distribution of phosphor particles across the light emitting surface, or surface of an intermediate layer, if present (Block 230). For example, agitation may be performed as described in "Self-Assembly of Particles for Densest Packing By Mechanical Vibration", A. B. Yu, et al., Phys Rev Lett, December 2006, which is incorporated herein by reference in its entirety. However, various other methods of agitation may be utilized, without limitation. The phosphor particles in the carrier material are caused to become arranged in a densely packed layer at the light emitting surface, or surface of an intermediate layer, if present (Block 240). The formation of the densely packed layer may be facilitated by subjecting the chip to centrifugal force (Block 242, FIG. 9).

The carrier material is then removed without disturbing the densely packed layer of phosphor particles (Block 250) and a layer of encapsulating material is applied over the densely packed layer, also without disturbing the densely packed layer of phosphor particles (Block 260). In some embodiments, no additional encapsulating material is applied. The encapsulating material is then cured without disturbing the densely packed layer of particles (Block 270). In some embodiments, cured encapsulating material above the densely packed layer that is devoid of phosphor particles is removed and/or reduced. (Block 280).

Figure 10:
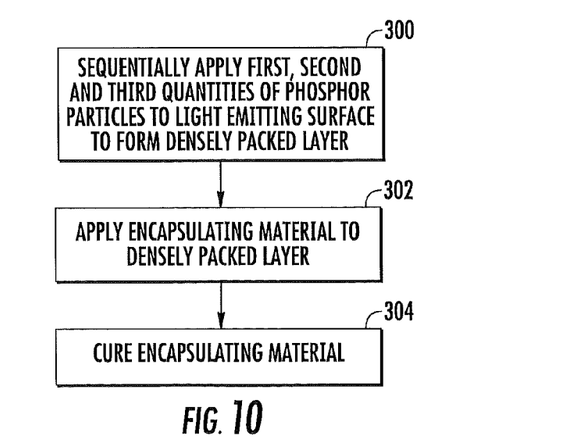

Referring to FIG. 10, operations for making LEDs, according to other embodiments of the present invention, are described. In some embodiments, first, second and third quantities of phosphor particles are sequentially applied to at least a portion of a light emitting surface of a semiconductor light emitting element (Block 300). Phosphor particles in the first and third quantities are small in size relative to phosphor particles in the second quantity. As such, the smaller phosphor particles in the first and third quantities become closely arranged around the larger phosphor particles in the second quantity so as to form a densely packed layer at the light emitting surface. A layer of encapsulating material (e.g., silicone) is applied to the densely packed layer of phosphor particles (Block 302) and then cured (Block 304) without disturbing the densely packed layer of phosphor particles.

The first, second and third quantities of phosphor particles are sequentially applied in a reduced viscosity environment. Such an environment may include air or a liquid polymeric material, such as silicone, that has its viscosity lowered. If a liquid material used, the viscosity can be lowered by heating the liquid material and/or by adding a solvent, such as xylene or hexane. The solvent reduces viscosity of the liquid material by breaking the polymer chains (e.g., silicone chains) of the phosphor-containing material. This causes the phosphor particles to drop out to the light emitting surface. The solvent is subsequently removed, for example, via evaporation prior to curing of the phosphor-containing material. Upon removal of the solvent, the polymer chains become re-established.

Figure 11:
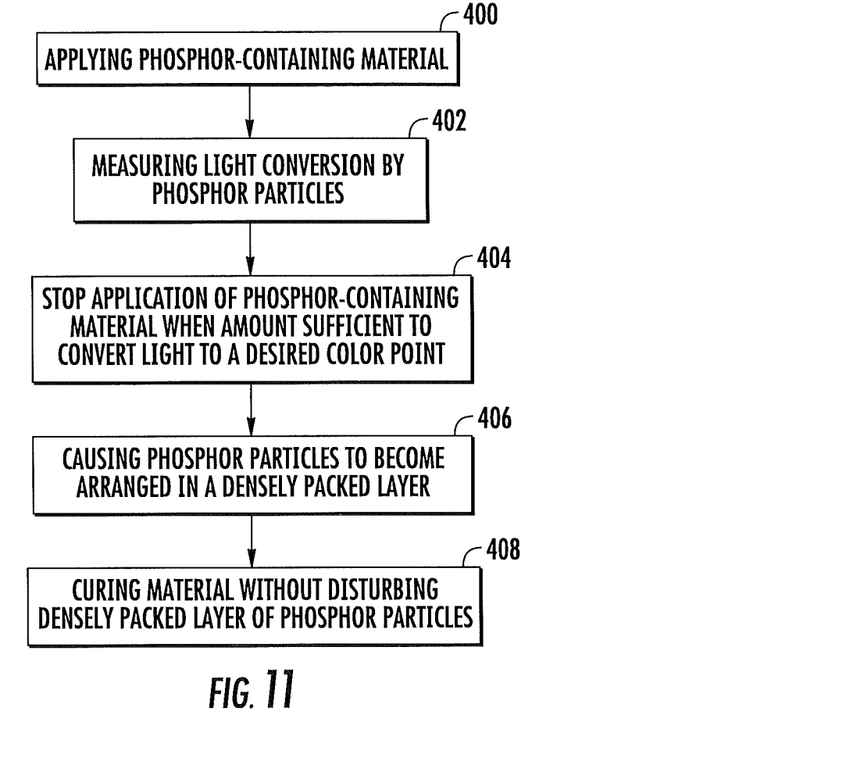

Referring to FIG. 11, operations for making LEDs, according to other embodiments of the present invention, are described. In some embodiments, phosphor-containing material is applied on at least a portion of a light emitting surface of a semiconductor light emitting element (Block 400). The light emitting surface emits light having a first dominant wavelength upon the application of a voltage to the semiconductor light emitting element, and the phosphor particles in the phosphor-containing material convert light emitted by the light emitting surface to light having a second dominant wavelength different from the first dominant wavelength. The amount of light conversion by the phosphor particles in the phosphor-containing material is measured (Block 402). In some embodiments, the amount of light conversion by the phosphor particles in the phosphor-containing material is measured in real time as the phosphor-containing material is applied to the light emitting surface. In other embodiments, an amount is added and then light conversion measurements are taken. This iteration is repeated until a desired color point is reached.

When the amount of phosphor-containing material is sufficient to convert light to a desired color point, no more phosphor-containing material is added to the light emitting surface (Block 404). The phosphor particles in the material are then caused to become arranged in a densely packed layer within the material at the light emitting surface (Block 406). As described above, this may be effected by heating the phosphor-containing material to lower its viscosity and/or via the addition of a solvent that also lowers the viscosity of the phosphor-containing material. The material is then cured without disturbing the densely packed layer of phosphor particles (Block 408). If a solvent was used to lower viscosity, the solvent is removed, for example, via evaporation, prior to curing.

LEDs according to embodiments of the present invention may be utilized in light fixtures. As used herein, the term light fixture includes devices that are classified under UL 1598 safety standard. Exemplary light fixtures include, but are not limited to, lay-in fixtures, such as the LR24 from Cree LED Lighting, downlights, wall washer, pendants, surface mounts, and the like.

While particular embodiments are described herein, various combinations and sub-combinations of the structures described herein are contemplated and will be apparent to a skilled person having knowledge of this disclosure.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A semiconductor light emitting device, comprising:
a semiconductor light emitting element having a light emitting surface; and
a coating of phosphor-containing material on the light emitting surface, wherein the phosphor-containing material comprises at least two quantities of different phosphor particles, wherein the phosphor particles are arranged in a densely packed layer within the coating at the light emitting surface, and wherein the densely packed layer of phosphor particles does not extend all the way through the coating.

2. The semiconductor light emitting device of claim 1, wherein the at least two quantities of different phosphor particles are mixed together.

3. The semiconductor light emitting device of claim 1, wherein the at least two quantities of different phosphor particles are selected from the group of red phosphor particles, yellow phosphor particles, and green phosphor particles.

4. The semiconductor light emitting device of claim 1, wherein particles in one of the at least two quantities of different phosphor particles are larger than other phosphor particles in the phosphor-containing material.

5. The semiconductor light emitting device of claim 1, wherein an average distance that heat generated by the phosphor particles travels from the densely packed layer to the semiconductor light emitting element is substantially less than half the thickness of the coating.

6. The semiconductor light emitting device of claim 1, wherein the light emitting surface comprises a pattern of features extending outwardly to form receptacles for receiving the phosphor particles.

7. The semiconductor light emitting device of claim 1, further comprising an intermediate layer of material between the light emitting surface and coating of phosphor-containing material, wherein the intermediate layer of material comprises a pattern of features extending outwardly therefrom to form receptacles for receiving the phosphor particles.

8. The semiconductor light emitting device of claim 1, wherein the light emitting surface emits light having a first dominant wavelength upon the application of a voltage to the semiconductor light emitting element, and wherein the phosphor particles convert light emitted by the light emitting surface to light having a second dominant wavelength different from the first dominant wavelength.

9. The semiconductor light emitting device of claim 1, wherein the semiconductor light emitting element is selected from the group consisting of light emitting diodes and laser diodes.

10. The semiconductor light emitting device of claim 1, wherein the coating of phosphor-containing material comprises silicone or silicon.

11. A lighting device, comprising:
a semiconductor light emitting element that emits light having a first dominant wavelength upon the application of a voltage thereto; and
a coating of phosphor-containing material on a light emitting surface of the element, wherein the phosphor-containing material comprises at least two quantities of different phosphor particles, wherein the phosphor particles are arranged in a densely packed layer within the material at the light emitting surface, wherein the phosphor particles convert light emitted by the light emitting surface to light having a second dominant wavelength different from the first dominant wavelength, and wherein the densely packed layer of phosphor particles does not extend all the way through the coating.

12. The lighting device of claim 11, wherein the at least two quantities of different phosphor particles are mixed together.

13. The lighting device of claim 11, wherein the at least two quantities of different phosphor particles are selected from the group of red phosphor particles, yellow phosphor particles, and green phosphor particles.

14. The lighting device of claim 11, wherein particles in one of the at least two quantities of different phosphor particles are larger than other phosphor particles in the phosphor-containing material.

15. The lighting device of claim 11, wherein the light emitting surface comprises a pattern of features extending outward from the light emitting surface that form receptacles for receiving the phosphor particles.

16. The lighting device of claim 11, further comprising an intermediate layer of material between the light emitting surface and coating of phosphor-containing material, wherein the intermediate layer of material comprises a pattern of features extending outward therefrom that form receptacles for receiving the phosphor particles.

17. A semiconductor light emitting device, comprising:
a semiconductor light emitting element having a light emitting surface;
an element in adjacent, spaced-apart relationship with the light emitting surface; and
a coating of phosphor-containing material on the element, wherein the phosphor-containing material comprises at least two quantities of different phosphor particles, and wherein the phosphor particles are arranged in a densely packed layer within the coating.

18. The semiconductor light emitting device of claim 17, wherein the at least two quantities of different phosphor particles are mixed together.

19. The semiconductor light emitting device of claim 17, wherein the at least two quantities of different phosphor particles are selected from the group of red phosphor particles, yellow phosphor particles, and green phosphor particles.

20. The semiconductor light emitting device of claim 17, wherein the element comprises a lens or a reflective element.

* * * * *